US010718829B2

(12) United States Patent
Heeder et al.

(10) Patent No.: US 10,718,829 B2
(45) Date of Patent: Jul. 21, 2020

(54) OPTIMIZING UTILIZATION OF A WIRELESS POSITION SENSOR

(71) Applicant: SENSATA TECHNOLOGIES, INC., Attleboro, MA (US)

(72) Inventors: Nicholas J. Heeder, Saunderstown, RI (US); Edward F. O'Brien, Rehoboth, MA (US); Aditya Balasubramanian, Pawtucket, RI (US); Nevin R. Molyneaux, Crumlin (GB); Mark Duffy, Antrim (GB)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 88 days.

(21) Appl. No.: 16/171,570

(22) Filed: Oct. 26, 2018

(65) Prior Publication Data

US 2020/0132787 A1 Apr. 30, 2020

(51) Int. Cl.
*G01R 33/09* (2006.01)
*G01R 33/02* (2006.01)
*G01R 33/10* (2006.01)
*G01R 33/00* (2006.01)

(52) U.S. Cl.
CPC ....... *G01R 33/096* (2013.01); *G01R 33/0094* (2013.01); *G01R 33/0213* (2013.01); *G01R 33/10* (2013.01)

(58) Field of Classification Search
CPC . G01R 33/0094; G01R 33/10; G01R 33/0213
See application file for complete search history.

(56) References Cited

U.S. PATENT DOCUMENTS

| 5,372,221 A | 12/1994 | Jalbert |
| 5,826,683 A | 10/1998 | Murata et al. |
| 5,957,246 A * | 9/1999 | Suzuki ................. B60T 13/741 188/1.11 L |
| 6,371,250 B1 | 4/2002 | Bunker |
| 6,439,355 B1 | 8/2002 | Kimble |
| 6,464,306 B2 | 10/2002 | Shaw et al. |
| 6,748,310 B2 | 6/2004 | Tamasho et al. |
| 6,752,249 B1 | 6/2004 | Jungbecker et al. |
| 7,032,721 B2 | 4/2006 | Baumgartner |
| 7,117,748 B2 | 10/2006 | Baumann et al. |
| 9,157,820 B2 | 10/2015 | Heise et al. |
| 2009/0177362 A1 | 7/2009 | Schmitt et al. |
| 2011/0005872 A1* | 1/2011 | Baumgartner ...... F16D 65/0978 188/73.31 |

(Continued)

*Primary Examiner* — Alvaro E Fortich

(57) ABSTRACT

Methods, apparatuses, and computer program products for optimizing utilization of a wireless position sensor are disclosed. In a particular embodiment, a controller of the wireless position sensor receives output from a magnetic-field-dependent sensor of the wireless position sensor. The magnetic-field-dependent sensor is configured to register the strength of a magnetic field of a magnet attached to a mechanical component. In this example, the registered strength corresponds to a position of the mechanical component along a directional path. According to this embodiment, the controller generates a comparison of the output to one or more predefined movement signatures and based on the comparison, determines whether to change an operating state of one or more components of the wireless position sensor.

20 Claims, 9 Drawing Sheets

(56) References Cited

U.S. PATENT DOCUMENTS

2011/0174581 A1    7/2011  Vollert et al.
2014/0150570 A1*  6/2014  Nahum .................... G01L 1/00
                                                  73/862.541

* cited by examiner

OPTIMIZING UTILIZATION OF A WIRELESS POSITION SENSOR

TECHNICAL FIELD

The present disclosure relates to wireless position sensors.

BACKGROUND ART

Limited wireless sensor solutions are available in the market today. One of the key challenges associated with creating a wireless sensor is limited power capacity of a battery. Given the limitations of battery technology, unique alternatives must be used to optimize electronic design and power management. Most sensing solutions have power requirements far exceeding the capability of standard batteries.

SUMMARY OF THE INVENTION

Methods, apparatuses, and computer program products for optimizing utilization of a wireless position sensor are disclosed. In a particular embodiment, a controller of the wireless position sensor receives output from a magnetic-field-dependent sensor of the wireless position sensor. The magnetic-field-dependent sensor is configured to register the strength of a magnetic field of a magnet attached to a mechanical component. In this example, the registered strength corresponds to a position of the mechanical component along a directional path. According to this embodiment, the controller generates a comparison of the output to one or more predefined movement signatures and based on the comparison, determines whether to change an operating state of one or more components of the wireless position sensor.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

So that those having ordinary skill in the art to which the disclosed technology appertains will more readily understand how to make and use the same, reference may be had to the following drawings.

DESCRIPTION OF EMBODIMENTS

Figure 1:
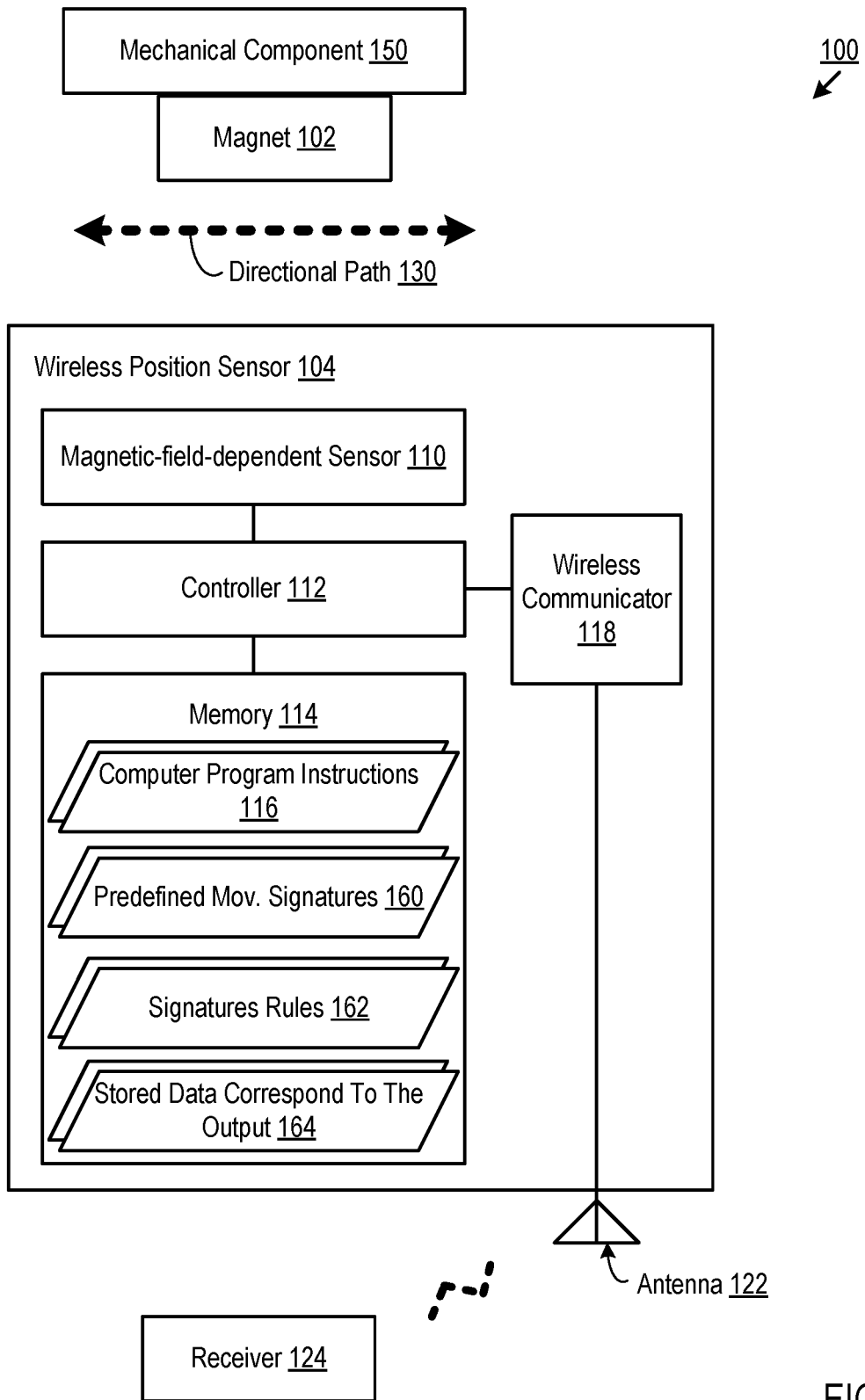
FIG. 1 is a block diagram of an illustrative embodiment of an apparatus of a wireless position sensor that is optimized for utilization.

The present disclosure describes optimizing utilization of a wireless position sensor. A wireless position sensor may be configured to monitor and measure movement of a mechanical component using a magnetic-field-dependent sensor. According to embodiments of the present invention, the wireless position sensor may also be configured to use the output of the magnetic-field-dependent sensor to identify patterns in the use of the mechanical component, which may be used to identify the conditions in which the wireless position sensor is operating. As will be explained in detail below, the wireless position sensor may be configured to make changes to operating states of one or more components within the wireless position sensor, based on the identification of the conditions in which the wireless position sensor is operating.

For example, if the wireless position sensor is configured to monitor the movement of an automobile brake caliper, the output of the magnetic-field-dependent sensor may indicate this movement but may also include data that is useful for identifying whether the automobile is moving. This information may be relevant because if the automobile is not moving, then the main controller of the automobile may not be able to receive transmissions from the wireless position sensor. If the main controller is not able to receive transmissions, then the wireless position sensor may be able to reduce its battery consumption by keeping the wireless communicator within the position sensor in a low power state and storing the movement data for a time when the automobile is moving and thus capable of receiving transmissions.

By identifying the conditions in which the wireless position sensor is operating, the wireless position sensor may be configured to implement power saving features to improve the efficient utilization of the component, and thus reduce overall battery consumption of the wireless position sensor.

In addition to the advantage described above of using the output of the magnetic-field-dependent sensor to implement power saving features, there is another advantage that results from the dual utilization of the magnetic-field-dependent sensor. Specifically, by utilizing the magnetic-field-dependent sensor, which has a first purpose of monitoring a position of a mechanical component, to accomplish a second purpose of providing data that is useful to making a decision regarding changes to the operating state of a component, the overall utilization of the wireless position sensor is increased without having to add an additional sensor, such as an accelerometer, to provide data applicable to making a decision regarding the operating state of a component.

The other advantages, and other features of the apparatuses and methods disclosed herein, will become more readily apparent to those having ordinary skill in the art from the following detailed description of certain embodiments taken in conjunction with the drawings which set forth representative embodiments of the present invention. Like reference numerals are used herein to denote like parts.

Further, words defining orientation such as "upper", and "lower" are merely used to help describe the location of components with respect to one another. For example, an "upper" surface of a part is merely meant to describe a surface that is separate from the "lower" surface of that same part. No words denoting orientation are used to describe an absolute orientation (i.e., where an "upper" part must always be on top).

FIG. 1 is a block diagram of an illustrative embodiment of an apparatus (100) that includes a wireless position sensor (104) that is optimized for utilization. In the example of FIG. 1, the wireless position sensor (104) includes a magnetic-field-dependent sensor (110) that is coupled to a controller (112), which is coupled to a wireless communicator (118).

A magnetic-field-dependent sensor is configured to react in the presence of an external magnetic field and register the strength of magnetic field components. An example of a magnetic-field-dependent sensor includes but is not limited to an anisotropic magnetoresistive (AMR) sensor.

Anisotropic magnetoresistivity is the property of specific materials (e.g., permalloy—nickel-iron magnetic alloy) that have electric resistivity dependence on the strength and the direction of an applied magnetic field. The AMR effect arises from the simultaneous action of magnetization and spin-orbit interaction, and its detailed mechanism depends on the material. It can be for example due to a larger probability of s-d scattering of electrons in the direction of magnetization (which is controlled by the applied magnetic field). The net effect (in most materials) is that the electrical resistance has maximum value when the direction of current is parallel to the applied magnetic field.

An AMR sensor uses this property to measure the strength of magnetic fields. An example configuration of an AMR sensor includes four magnetoresistive plates grouped into a balanced Wheatstone bridge. When a magnetic field is introduced to the sensor, the sensitive axis of the sensor resistive elements that are parallel to the magnetic filed get offset in electrical resistivity, depending on the angle between current and magnetic field vectors. The offset imbalances the Wheatstone bridge. Each component magnetoresistive plate contributes to a change in the differential output voltage of the Wheatstone bridge, depending on the X,Y field direction in the sensor plane and on the direction of current flow in the resistors. This direction of current flow is either given by the alignment of the resistor paths or is forced in another direction by short-circuit contacts (barber poles). In this example, the AMR sensor registers the strength of the magnetic field as the offset in voltage between output terminals of the Wheatstone bridge. The output voltage can be expressed as the following equation:

$$\Delta V = S \times V_s \times M,$$

where S is the sensitivity of the sensor (e.g., 1 mV/V/G); $V_s$ is the supply voltage to the bridge; and M is the magnitude of the magnetic field in Gauss.

In the example of FIG. 1, the magnetic-field-dependent sensor (110) is configured to measure the strength of a magnetic field of a magnet (102) that is attached to a mechanical component (150). In this example, as the mechanical component (150) moves along a directional path (130), the magnet (102) gets closer or farther away from the magnetic-field-dependent sensor (110). Examples of a directional path may include geometric translation and angular displacement. As the magnet (102) gets closer to the magnetic-field-dependent sensor (110), the strength of the magnetic field of the magnet (102) applied to the resistive elements of the magnetic-field-dependent sensor (110) increases, causing the output of the magnetic-field-dependent sensor (110) to change. The output of the magnetic-field-dependent sensor (110) conversely changes as the magnet (102) gets farther away from the magnetic-field-dependent sensor (110) and the strength of the magnetic field of the magnet (102) applied to the resistive elements of the magnetic-field-dependent sensor (110) decreases. That is, the output of the magnetic-field-dependent sensor (110) registers the strength of a magnetic field of the magnet (102) attached the mechanical component (150). In this example, the registered strength corresponds to a position of the mechanical component along the directional path (130). Said another way, the output provides an indication of the length of relative movement, along the direction path (130), of the magnet (102), and thus the mechanical component (150). Using a magnetic-field-dependent sensor to monitor and measure movement of mechanical components may be used in a variety of applications.

For example, the wireless position sensor (104) may be attached to a caliper bracket and the magnet (102) may be attached to a floating brake caliper, such that the magnet (102) undergoes displacement or movement in a direction perpendicular to the axial direction of a brake disk of the brake caliper. In this example, the output of the magnetic-field-dependent sensor (110) is a measure of the strength of the magnetic field of the magnet (102), which corresponds to the position of the caliper.

The controller (112) of FIG. 1 is configured to utilize computer program instructions (116) stored in memory (114) to process the output of the magnetic-field-dependent sensor (110). Memory may refer to any storage medium known in the art including but not limited to random access memory (RAM), a magnetoresistive random access memory (MRAM), a spin-torque-transfer MRAM (STT-MRAM), flash memory, read-only memory (ROM), programmable read-only memory (PROM), erasable programmable read-only memory (EPROM), electrically erasable programmable read-only memory (EPROM), registers, and a hard disk. In the example of FIG. 1, the memory (114) is an exemplary storage medium that is coupled to the controller (112) such that the controller can read information from, and write information to, the storage medium. In an alternative configuration, the storage medium may be integral to the controller. In a particular embodiment, the controller may be a microprocessor or an application-specific integrated circuit (ASIC). Readers of skill in the art will realize that the functionality of the controller is not limited to a particular architecture. For example, in an alternative embodiment, the controller may be implemented as computer program logic.

In FIG. 1, the memory (114) may include computer program instructions (116) that when executed by the controller (112) cause the controller (112) to receive output from the magnetic-field-dependent sensor (110). As explained above, the output from the magnetic-field-dependent sensor (110) may include voltage readings across resistors within the magnetic-field-dependent sensor (110).

The controller (112) of FIG. 1 may be configured to utilize computer program instructions stored in memory (114) to process and analyze the output of the magnetic-field-dependent sensor (110). For example, the controller (112) may be configured to instruct the wireless communicator (118) to transmit the output of the magnetic-field-dependent sensor (110) or data corresponding to the output via a wireless antenna (122) to a receiver (124). In the above described brake caliper example, the receiver (124) may be coupled to a main controller located within an automobile. In this example, the main controller may use the information received from the wireless position sensor (104) to determine brake pad wear.

The memory (114) may also include computer program instructions (116) that when executed by the controller (112) cause the controller (112) to generate a comparison of the output to one or more predefined movement signatures (160). A predefined movement signature may provide, in a variety of formats, information corresponding to a particular movement of a mechanical component. For example, a particular predefined movement signature may include information corresponding to a particular position of the mechanical component. Generating the comparison of the output to the one or more predefined movement signatures may include determining values corresponding to the output and determining values corresponding to the predefined movement signatures that can be compared. In a particular embodiment, determining values may include transforming the output into data values or transforming the data values in the predefined movement signature into values that can be compared to the output of the magnetic-field-dependent sensor (110).

In addition, generating a comparison of the output to the one or more predefined movement signatures may also include applying one or more signature rules. A signature rule may specify how data corresponding to the output is compared to data corresponding to the predefined movement signature. For example, a particular predefined movement signature may indicate information corresponding to a particular position. In this example, a signature rule associated with the particular predefined movement signature may specify that the output of the magnetic-field-dependent sensor (110) matches the particular predefined movement signature if the output corresponds to a position that is greater than the position corresponding to the particular predefined movement signature.

As another example, a particular predefined movement signature may indicate information corresponding to a plurality of positions and the corresponding signature rule may specify that the output matches the particular predefined movement signature if the output corresponds to a plurality of positions that are within a similar range of the plurality of positions corresponding to the particular predefined movement signature. By way of another example, the particular predefined movement signature may indicate information corresponding to a plurality of positions and the corresponding signature may specify that the output matches the particular predefined movement signature if the output corresponds to a plurality of positions that are above a threshold position for a particular amount of time.

In another example, the particular predefined movement signature may correspond to a change in difference between two measurements of positions. In this example, the corresponding signature rule may specify a variety of parameters for comparison, such that the change in difference exceeds a threshold or exceeds a threshold for a specific amount of time. Readers of skill in the art will realize that any number of parameters and rules may be used for comparing data corresponding to the output of the magnetic-field-dependent sensor (110) and data corresponding to the predefined movement signatures (162).

In the example of FIG. 1, the memory (114) may also include computer program instructions (116) that when executed by the controller (112) cause the controller (112) to, based on the comparison, determine whether to change an operating state of one or more components of the wireless position sensor (104). An operating state of a component may be a particular power consumption state or a state indicating the number and types of instructions that the component can perform. For example, the wireless communicator (118) may have a 'low power' operating state and a 'normal' operating state. In a particular embodiment, in the 'low power' operating state, the wireless communicator is turned off or asleep. In this example, when the wireless communicator (118) is in the 'normal' operating state, the wireless communicator is on or awake. According to the example of FIG. 1, the controller (112) may be configured to change or switch components from one operating state to another operating state based on the comparison (652). As will be explained below, indications of movement or patterns of movements indicated in the output can be indicators of conditions that the wireless position sensor is operating in. In an effort to conserve battery power, the wireless position sensor may make adjustments in response to determining the conditions that the wireless position sensor is operating in.

Changing the operating state may be carried out by identifying one or more actions for one or more components of the wireless position sensor (104) to perform and instructing the one or more components to perform the identified actions. For example, a signature rule may specify one or more actions to take in response to the output of the magnetic-field-dependent sensor satisfying one or more conditions specified in the signature rule. Actions may include waking up a particular component and instructing a particular component to perform an action. For example, identifying one or more actions for one or more components of the wireless position sensor (104) to perform and instructing the one or more components to perform the identified actions may include waking up the wireless communicator (118) and instructing the wireless communicator (118) to transmit data associated with the output of the magnetic-field-dependent sensor (110) and stored data (164) associated with previously sampled output.

Using the output of the magnetic-field-dependent sensor (110) to indicate movement of a mechanical component and to serve as criteria for determining whether to change the operating states of components of the wireless position sensor (104) allows the wireless position sensor (104) to have power saving features without having to add an additional sensor to provide a wake up stimulus, such as an accelerator, which may increase the size and cost of the wireless position sensor.

Figure 2:
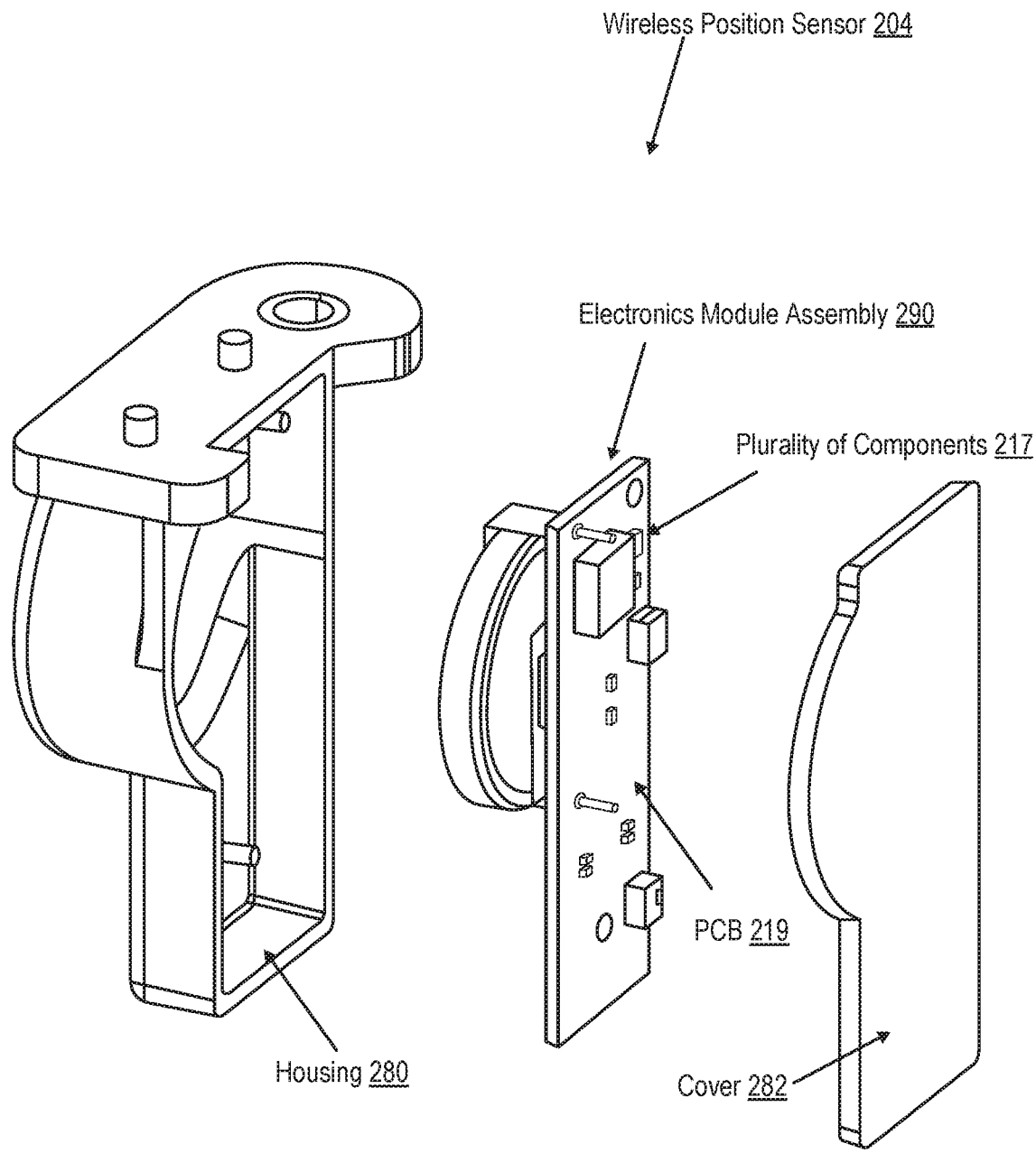
FIG. 2 depicts a disassembled view of an illustrative embodiment of a wireless position sensor that is optimized for utilization according to at least one embodiment of the present disclosure

FIG. 2 depicts a disassembled view of an illustrative embodiment of a wireless position sensor (204) that is optimized for utilization according to at least one embodiment of the present disclosure. In the example of FIG. 2, the wireless position sensor (204) includes an electronics module assembly (EMA) (290) that is configured to attach to a housing (280), which is encapsulated by a cover (282).

In the example of FIG. 2, the EMA (290) includes a plurality of components (217) attached to a printed circuit board (219). In a particular embodiment, the plurality of components (217) include components from the wireless position sensor (104) of FIG. 1, such as a magnetic-field-dependent sensor, a controller, memory, a wireless communicator, a battery, and an antenna.

In this example, the controller of the wireless position sensor (204) of FIG. 2 may be configured to utilize computer program instructions stored in memory to process the output of the magnetic-field-dependent sensor. The memory may include computer program instructions that when executed by the controller cause the controller to receive output from the magnetic-field-dependent sensor. The controller may also be configured to utilize computer program instructions stored in memory to process and analyze the output of the magnetic-field-dependent sensor. The memory may also include computer program instructions that when executed by the controller cause the controller to generate a comparison of the output to one or more predefined movement signatures. The memory may also include computer program instructions that when executed by the controller cause the controller to, based on the comparison, determine whether to change an operating state of one or more components of the wireless position sensor (204). The memory may also include computer program instructions that when executed by the controller cause the controller to, based on the comparison, identify one or more actions for one or more components of the wireless position sensor (204) to perform and instructing the one or more components to perform the identified actions.

For example, a signature rule may specify one or more actions to take in response to the output of the magnetic-field-dependent sensor satisfying one ore more conditions specified in the signature rule. Actions may include waking up a particular component and instructing a particular component to perform an action. For example, identifying one or more actions for one or more components of the wireless position sensor (204) to perform and instructing the one or more components to perform the identified actions may include waking up the wireless communicator and instructing the wireless communicator to transmit data associated with the output of the magnetic-field-dependent sensor and stored data associated with previously sampled output.

Figure 3:
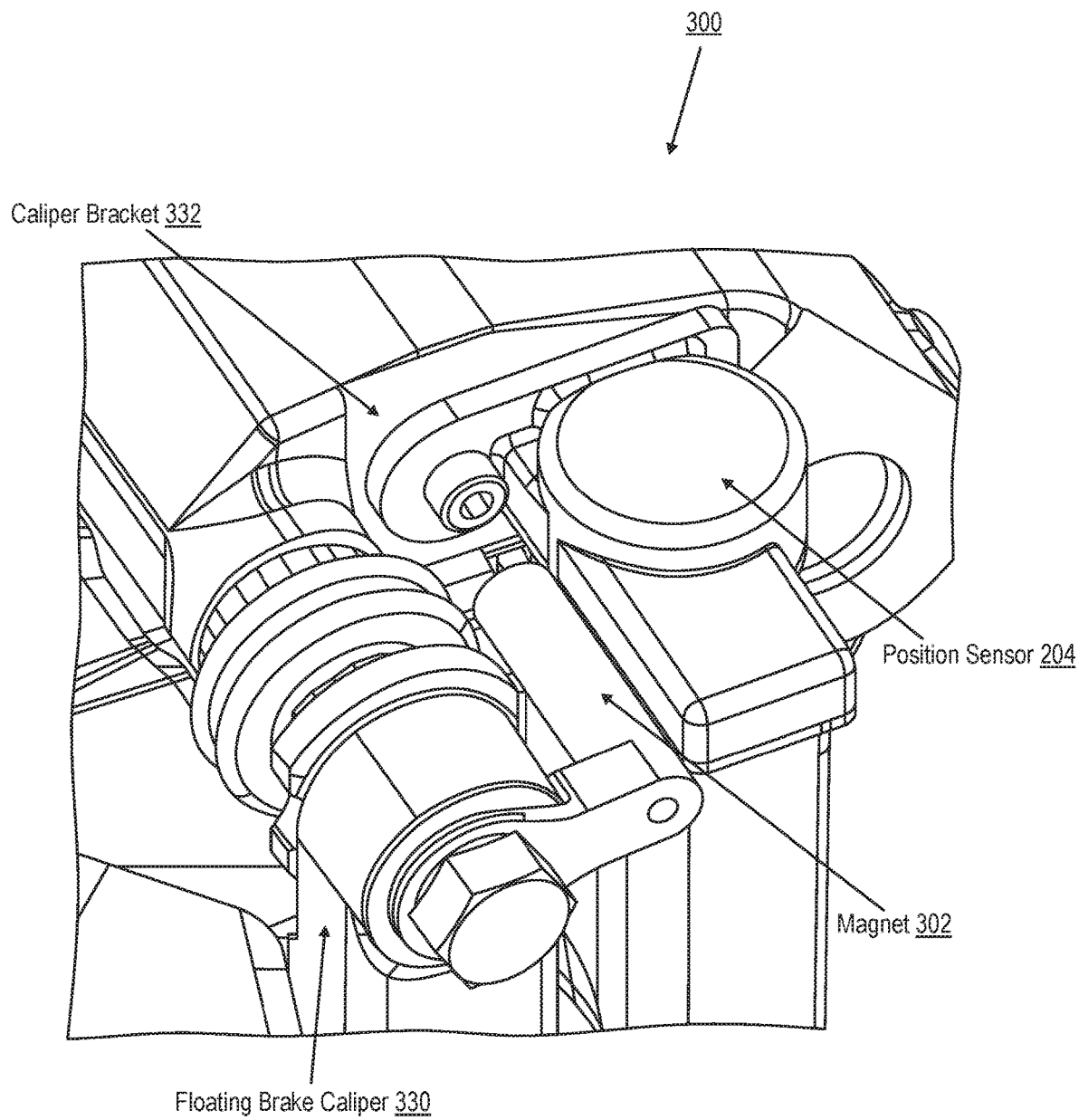
FIG. 3 depicts an isometric view of an apparatus that includes the wireless position sensor of FIG. 2 attached to a brake caliper bracket.

FIG. 3 depicts an isometric view of an apparatus (300) that includes the wireless position sensor (204) of FIG. 2 attached to a brake caliper bracket (332). In the example of FIG. 3, a magnet (302) is attached to a floating brake caliper (330), such that the magnet (302) undergoes displacement or movement in a direction perpendicular to the axial direction of a brake disk of the floating brake caliper (330). Readers of skill in the art will realize that in an alternative configuration, the wireless position sensor (204) may be attached to the mechanical component that moves and the magnet (302) may be attached to the fixed component.

In this example, the magnetic-field-dependent sensor in the wireless position sensor (204) may be configured to measure the strength of a magnetic field of the magnet (302) that is attached to the floating brake caliper (330). In FIG. 3, as the floating brake caliper (330) moves, the magnet (302) gets closer or farther away from the magnetic-field-dependent sensor. In a particular embodiment, the magnetic-field-dependent sensor may be translating in the direction perpendicular to the rotor plane. As the magnet (302) gets closer to the magnetic-field-dependent sensor, the strength of the magnetic field of the magnet (302) applied to the resistive elements of the magnetic-field-dependent sensor increase, causing the output of the magnetic-field-dependent sensor to change. The output of the magnetic-field-dependent sensor conversely changes as the magnet (302) gets farther away from the magnetic-field-dependent sensor and the strength of the magnetic field of the magnet (302) applied to the resistive elements of the magnetic-field-dependent sensor decreases. That is, the output of the magnetic-field-dependent sensor provides an indication of the length of relative movement, along a direction path, of the magnet (302), and thus the floating brake caliper (330).

As explained above, the controller of the wireless position sensor (204) may be configured to process and output of the magnetic-field-dependent sensor. For example, the controller may be configured to receive output from a magnetic-field-dependent sensor of the wireless position sensor; generate a comparison of the output of the magnetic-field-dependent sensor to one or more predefined movement signatures; based on the comparison, determine whether to change an operating state of one or more components of the wireless position sensor (204); and based on the comparison, identify one or more actions for one or more components of the wireless position sensor (204) to perform and instructing the one or more components to perform the identified actions.

Figure 4:
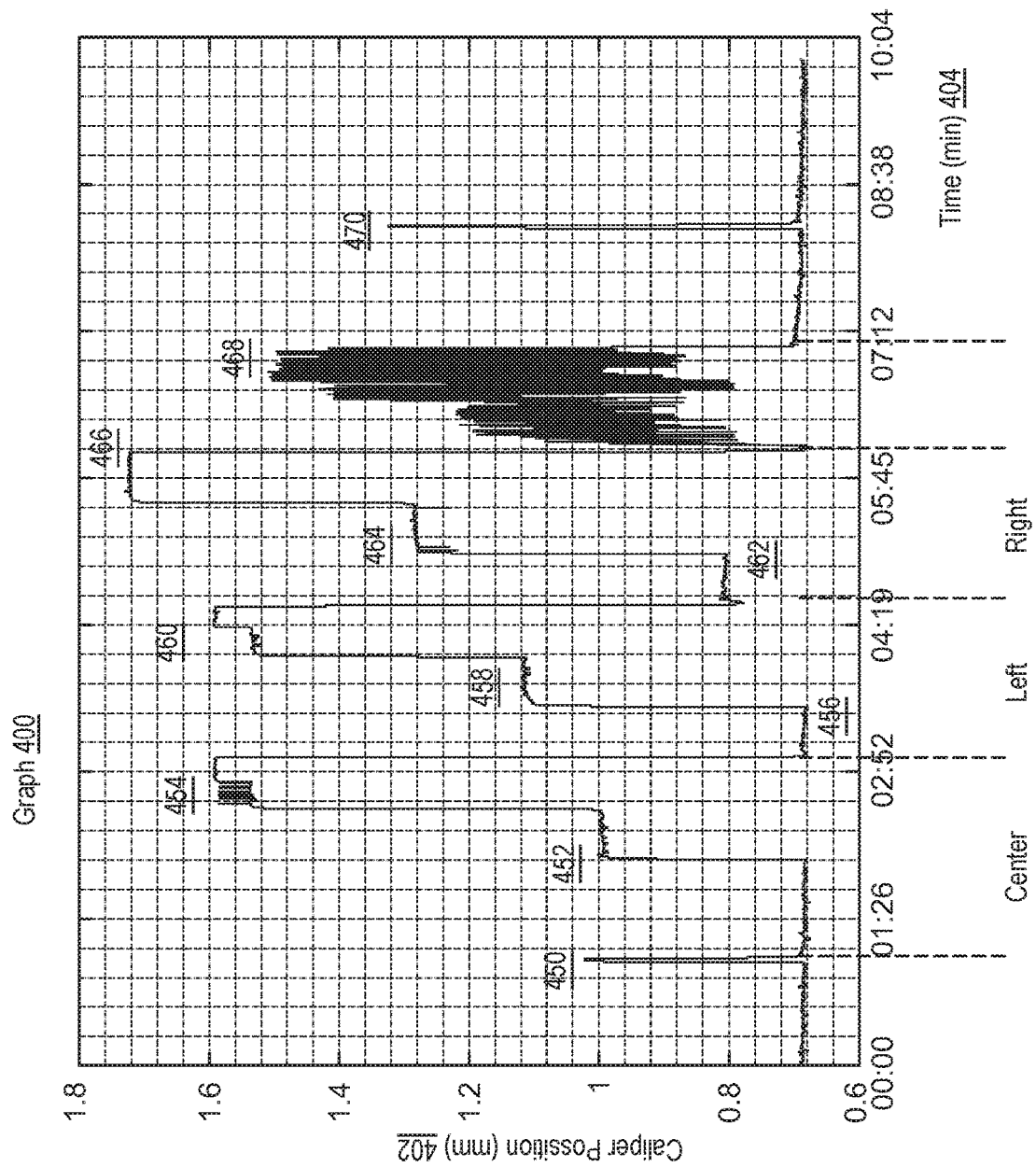
FIG. 4 is a graph depicting changes to caliper position detected by the wireless position sensor in the apparatus of FIG. 3.

FIG. 4 is a graph (400) depicting changes to caliper position detected by the wireless position sensor (204) in the apparatus (300) of FIG. 3. As explained in FIG. 3, the wireless position sensor (204) is attached to a caliper bracket (332) and a magnet (302) is attached to a floating brake caliper (330). As the floating brake caliper (330) moves, the magnet (302) moves relative to the magnetic-field-dependent sensor of the wireless position sensor (204). The magnetic-field-dependent sensor registers the strength of the magnetic field of the magnet, such that the output of the magnetic-field-dependent sensor corresponds to the movement of the floating brake caliper (330).

In the graph (400), the vertical axis (402) indicates caliper positions as measured by the magnetic-field-dependent sensor of the wireless position sensor (204) over a period of time, which is indicated on the horizontal axis (404). The caliper positions in the graph (400) are matched to actions of the motor vehicle. As will be explained below, corresponding the actions of the motor vehicle with the recorded caliper position may be useful for generating predefined movement signatures and signatures rules.

For example, at time (450), the brakes of the motor vehicle are applied to turn the vehicle on, which correspond to an increase in the position of the caliper. In a particular embodiment, this change in position of the brake caliper could be recorded as a predefined movement signature. Continuing with this example, a corresponding signature rule could be created that specified that if the caliper position changes above a particular threshold amount, such as the amount in the predefined movement signature, the wireless position sensor (204) should take one or more actions. In this example, the wireless position sensor (204) could use this predefined movement signature matching the application of brakes and its corresponding signature rule to determine if the vehicle has been turned on. Identifying when the vehicle is turn on or in motion could be useful because in many instances, a receiver with the vehicle may be configured to only receive transmission from a motion sensor if the vehicle is turned on or in motion. In this example, the wireless position sensor (204) may save power by storing the position data at times that the wireless position sensor determines the vehicle is not turned on or not moving, and transmitting the position data only when the wireless position sensor determines the vehicle is turned on or is moving.

At time (452), half brakes are applied and at time (454), full brakes are applied. As explained above, a predefined movement signature may be created to correspond the caliper positions with a braking pattern. The resulting predefined movement signature and signature rule may be useful in optimizing processing of output from the magnetic-field-dependent sensor that matches the predefined movement signature. For example, in response to a particular braking behavior, it may be advantageous to change the frequency at which the output of the magnetic-field-dependent sensor is sampled by the controller or the frequency at which the output of the magnetic-field-dependent sensor is transmitted.

At time (456), time (458), and time (460), the brakes are applied in different states (none, half, and full) with the steering in the left position. At time (462), time (464), and time (466), the brakes are applied in different states (none, half, and full) with the steering in the right position. As can be seen in the graph (400), changing the steering position may impact the caliper position at different braking states. Readers of skill in the art will realize that analyzing the effect of these variations in steering position on caliper position at various braking states may be useful in creating robust predefined movement signatures and signature rules. The outside temperature or the temperature of the braking components as indicated by something such as driving time, are examples of other variations that may be considered when designing and implementing predefined movement signatures and signatures rules. In a particular embodiment, the controller may include additional rules that modify parameters within the signature rules to adjust for other variables, such as temperature.

At time (468), the brakes are rapidly applied. In a particular embodiment, a predefined movement signature may be created to correspond to rapid brake applies behavior. Rapid brake application may be an indication that the vehicle is in a position where heightened monitoring of systems, such as brake pad wear may be useful to the vehicle's main controller. As such, in this example, a signature rule may be created to increase the frequency at which the output of the magnetic-field-dependent sensor is sampled by the controller and increase the frequency at which the output of the magnetic-field-dependent sensor is transmitted.

At time (470), the brakes are applied to turn the vehicle off. As explained at time (450), predefined movement signatures and signature rules may be created to correspond braking behavior with caliper movement and implement data processing algorithms that optimize power consumption by components of the wireless position sensor (204). For example, as explained above, it may be useful to identify and determine times when the vehicle is on/off and either moving or not moving to avoid transmitting position data at times that the vehicle's main controller receiver may not be capable of receiving.

Figure 5:
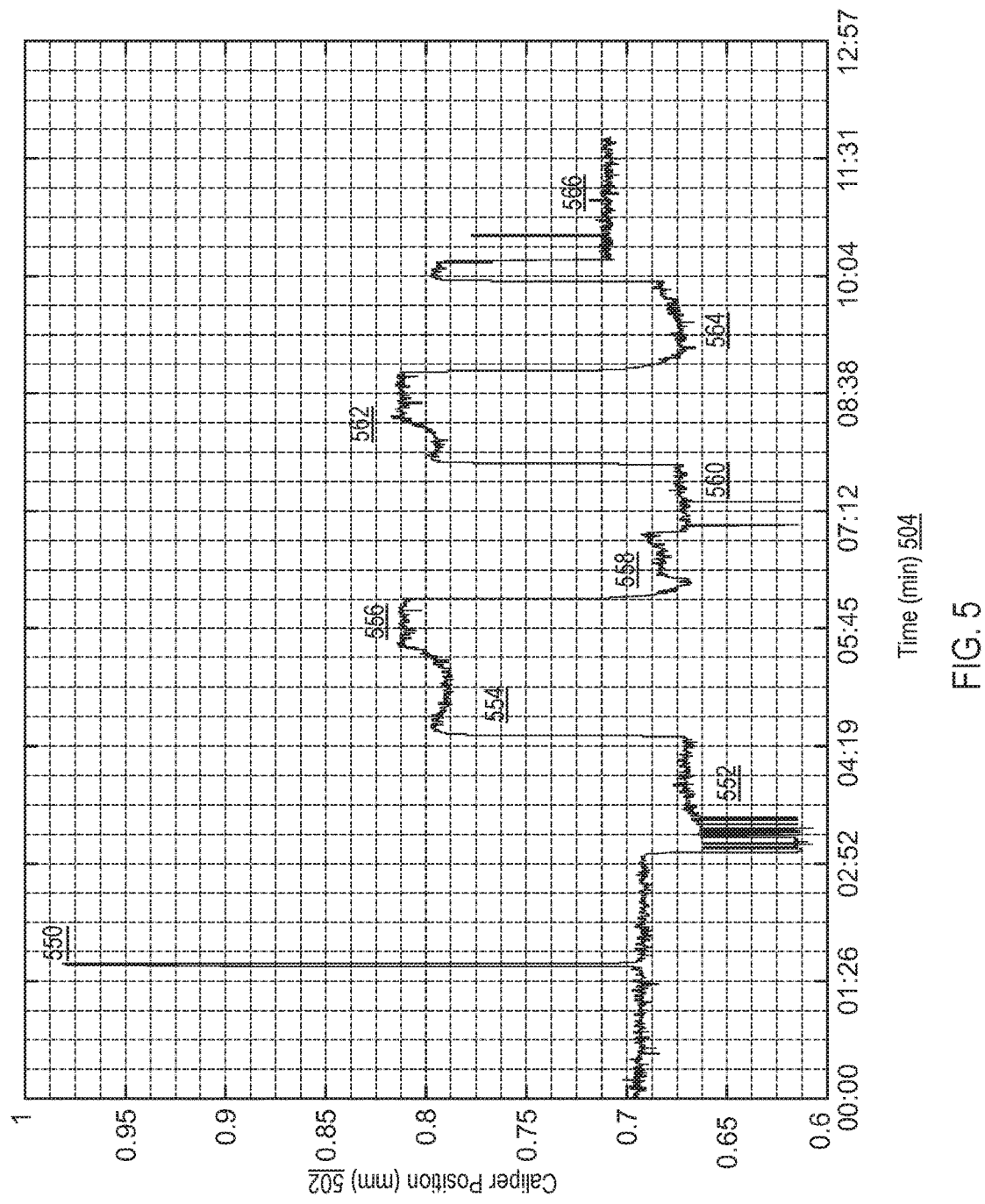
FIG. 5 is another graph depicting changes to caliper position detected by the wireless position sensor in the apparatus of FIG. 3.

FIG. 5 is another graph (500) depicting changes to caliper position detected by the wireless position sensor (204) in the apparatus (300) of FIG. 3. As explained in FIG. 3, the wireless position sensor (204) is attached to a caliper bracket (332) and a magnet (302) is attached to a floating brake caliper (330). As the floating brake caliper (330) moves, the magnet (302) moves relative to the magnetic-field-dependent sensor of the wireless position sensor (204). The magnetic-field-dependent sensor registers the strength of the magnetic field of the magnet, such that the output of the magnetic-field-dependent sensor corresponds to the movement of the floating brake caliper (330).

In the graph (500), the vertical axis (502) indicates caliper position as measured by the output of the magnetic-field-dependent sensor of the wireless position sensor (204) over a period of time, which is indicated on the horizontal axis (504). The caliper positions in the graph (500) are matched to actions of the motor vehicle. As will be explained below, corresponding the actions of the motor vehicle with the recorded caliper position may be useful for generating predefined movement signatures and signatures rules.

In the graph (500), the steering angle is changed and the impact on caliper position is recorded by the wireless position sensor (204). At time (550), the steering angle is in the center position and the vehicle is started. At time (552), the steering angle is changed from the center position to the left position. At time (554), the steering angle is changed from the left position to the center position. At time (556), the steering angle is changed from the center position to the right position. At time (558), the steering angle is changed from the right position to the center position. At time (560), the steering angle is changed from the center position to the left position. At time (562), the steering angle is changed from the left position to the right position. At time (564), the steering angle is changed from the right position to the left position. At time (566), the steering angle is changed from the left position to the center position.

In a particular embodiment, this change in position of the brake caliper could be recorded as a predefined movement signature. Continuing with this example, a corresponding signature rule could be created that specified that if the caliper position changes above a particular threshold amount, such as the amount in the predefined movement signature, the wireless position sensor (204) should take one or more actions. In this example, the wireless position sensor (204) could use this predefined movement signature matching the change in steering angle and its corresponding signature rule to determine if the vehicle has been turned on. Identifying when the vehicle is turn on or in motion could be useful because in many instances, a receiver with the vehicle may be configured to only receive transmission from a motion sensor only if the vehicle is turned on or in motion. In this example, the wireless position sensor (204) may save power by storing the position data at times that the wireless position sensor determines the vehicle is not turned on or not moving, and transmitting the position data only when the wireless position sensor determines the vehicle is turned on or is moving.

Figure 6:
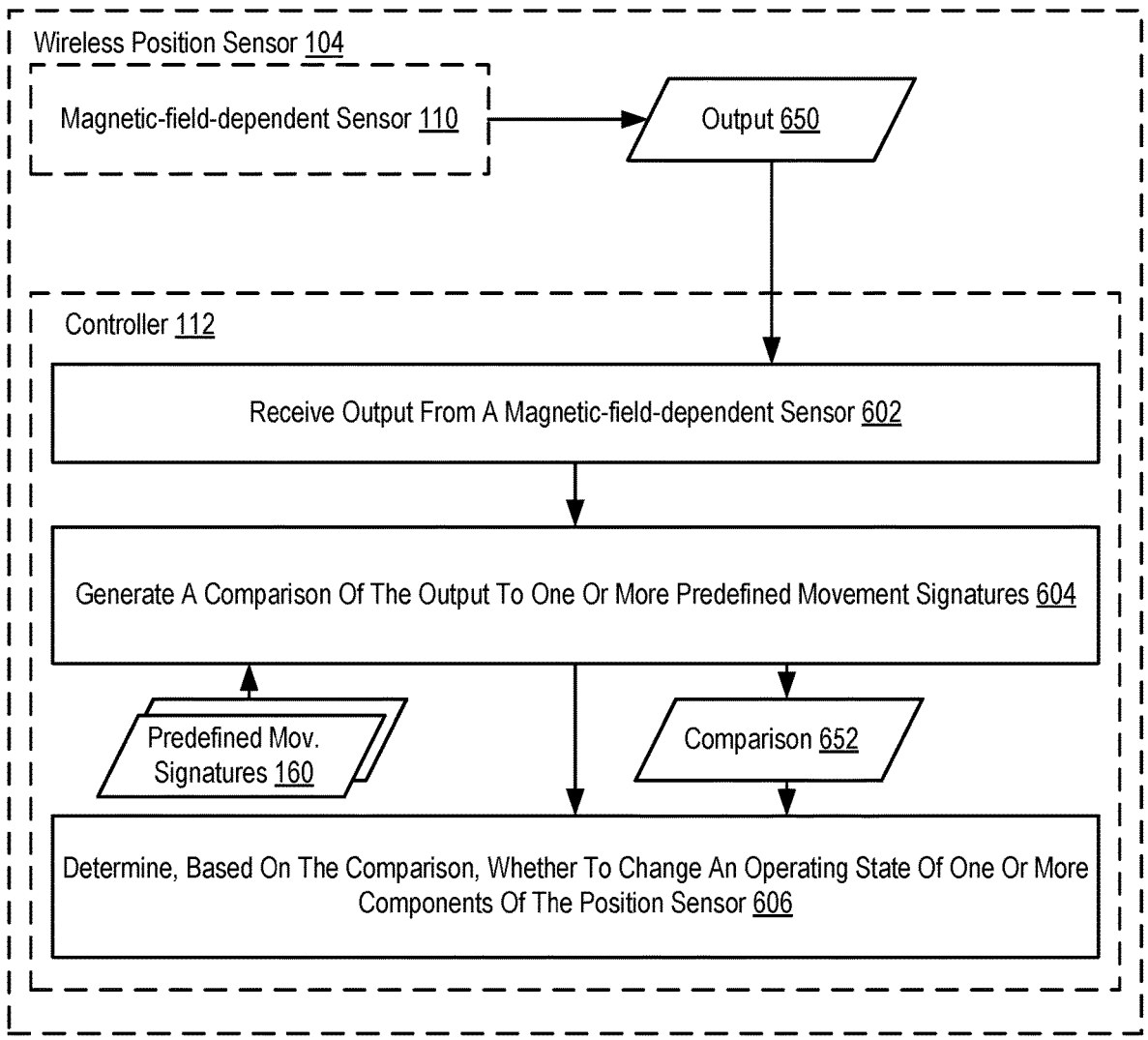
FIG. 6 is a flow chart of a particular illustrative embodiment of a method of optimizing utilization of the wireless position sensor of FIG. 1.

FIG. 6 is a flow chart of a particular illustrative embodiment of a method of optimizing utilization of a wireless position sensor. The method of FIG. 6 includes the controller (112) of FIG. 1. As explained above, examples of a controller include but are not limited to a processor executing computer program instructions and computer hardware logic. The method of FIG. 6 includes receiving (602), by a controller (112) of a wireless position sensor (104), output (650) from a magnetic-field-dependent sensor (110) of the wireless position sensor (104). In the example of FIG. 6, the magnetic-field-dependent sensor (110) is configured to register lengths of relative movement, along a directional path, of a magnet attached to a mechanical component. Receiving (602), by a controller (112) of a wireless position sensor (104), output (650) from a magnetic-field-dependent sensor (110) of the wireless position sensor (104) may be carried out by sampling voltage readings across resistors within the magnetic-field-dependent sensor (110).

The method of FIG. 6 also includes generating (604), by the controller (112), a comparison (652) of the output (650) to one or more predefined movement signatures (160). A predefined movement signature may provide, in a variety of formats, information corresponding to a particular movement of a mechanical component. For example, a particular predefined movement signature may include information corresponding to a particular position of the mechanical component. Generating (604), by the controller (112), a comparison (652) of the output (650) to one or more predefined movement signatures (160) may be carried out by determining values corresponding to the output and determining values corresponding to the predefined movement signatures that can be compared. In a particular embodiment, determining values may include transforming the output into data values or transforming the data values in the predefined movement signature into values that can be compared to the output of the magnetic-field-dependent sensor (110).

In addition, generating a comparison of the output to the one or more predefined movement signatures may also include applying one or more signature rules. A signature rule may specify how data corresponding to the output is compared to data corresponding to the predefined movement signature. For example, a particular predefined movement signature may indicate information corresponding to a particular position. In this example, a signature rule associated with the particular predefined movement signature may specify that the output of the magnetic-field-dependent sensor (110) matches the particular predefined movement signature if the output corresponds to a position that is greater than the position corresponding to the particular predefined movement signature.

As another example, a particular predefined movement signature may indicate information corresponding to a plurality of positions and the corresponding signature rule may specify that the output matches the particular predefined movement signature if the output corresponds to a plurality of positions that are within a similar range of the plurality of positions corresponding to the particular predefined movement signature. By way of another example, the particular predefined movement signature may indicate information corresponding to a plurality of positions and the corresponding signature may specify that the output matches the particular predefined movement signature if the output corresponds to a plurality of positions that are above a threshold position for a particular amount of time.

In another example, the particular predefined movement signature may correspond to a change in difference between two measurements of positions. In this example, the corresponding signature rule may specify a variety of parameters for comparison, such that the change in difference exceeds a threshold or exceeds a threshold for a specific amount of time. Readers of skill in the art will realize that any number of parameters and rules may be used for comparing data corresponding to the output of the magnetic-field-dependent sensor (110) and data corresponding to the predefined movement signatures (162).

The method of FIG. 6 also includes based on the comparison (652), determining (606), by the controller (112), whether to change an operating state of one or more components of the wireless position sensor (104). An operating state of a component may be a particular power consumption state or a state indicating the number and types of instructions that the component can perform. Determining (606), by the controller (112), based on the comparison (652), whether to change an operating state of one or more components of the wireless position sensor (104), may be carried out by determining if the output corresponds to a predefined movement signature and then examining a signature rule to determine the corresponding action to take.

For example, the wireless communicator (118) may have a 'low power' operating state and a 'normal' operating state. In a particular embodiment, the 'low power' operating state, the wireless communicator is turned off or asleep. In this example, when the wireless communicator (118) is in the 'normal' operating state, the wireless communicator is on or awake. According to the example of FIG. 1, the controller (112) may be configured to change or switch components from one operating state to another operating state based on the comparison (652). Indications of movement or patterns of movements indicated in the output can be indicators of conditions that the wireless position sensor is operating in.

In an effort to conserve battery power, the wireless position sensor may make adjustments in response to determining the conditions that the wireless position sensor is operating in.

Figure 7:
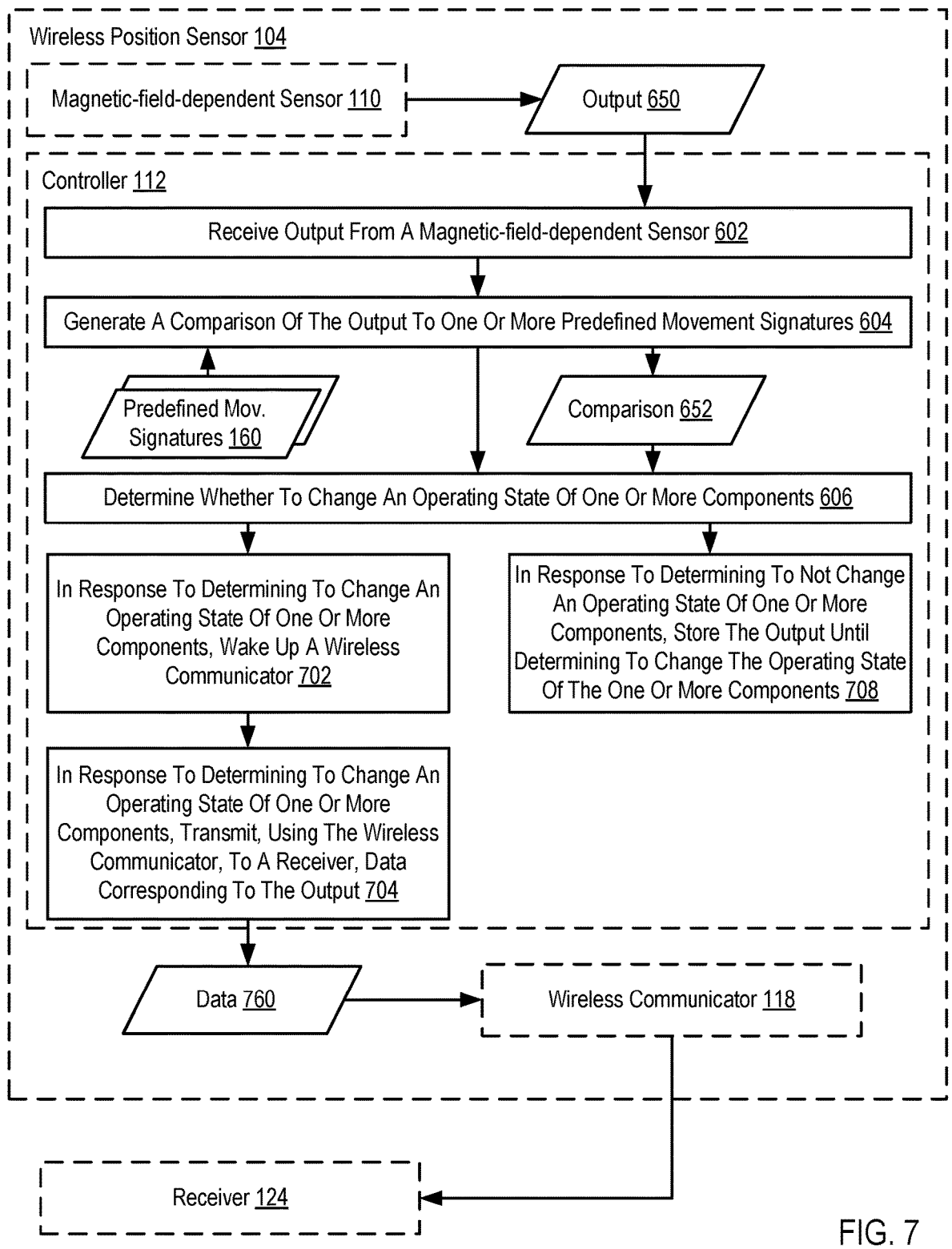
FIG. 7 is a flow chart of a second illustrative embodiment of a method of optimizing utilization of the wireless position sensor of FIG. 1.

FIG. 7 is a flow chart of a second illustrative embodiment of a method of optimizing utilization of the wireless position sensor (104) of FIG. 1. The method of FIG. 7 is similar to the method of FIG. 6 in that the method of FIG. 7 also includes receiving (602), by a controller (112) of a wireless position sensor (104), output (650) from a magnetic-field-dependent sensor (110) of the wireless position sensor (104); generating (604), by the controller (112), a comparison (652) of the output (650) to one or more predefined movement signatures (160); and based on the comparison (652), determining (606), by the controller (112), whether to change an operating state of one or more components of the wireless position sensor (104).

However, the method of FIG. 7 differs from the method of FIG. 6 in that in the method of FIG. 7 also includes in response to determining to change an operating state of one or more components of the wireless position sensor (104), waking up (702), by the controller (112), a wireless communicator (118) of the wireless position sensor (104). Waking up (702), by the controller (112), a wireless communicator (118) of the wireless position sensor (104) may be carried out by applying power to the wireless communicator.

The method of FIG. 7 also includes in response to determining to change an operating state of one or more components of the wireless position sensor (104), transmitting (704), by the controller (112), using the wireless communicator (118), to a receiver (124), data (760) corresponding to the output (650). Transmitting (704), using the wireless communicator (118), to a receiver (124), data (760) corresponding to the output (650) may be carried out by transmitting packets of data wireless via an antenna.

In the method of FIG. 7, in response to determining to not change an operating state of one or more components of the wireless position sensor (104), the method includes storing (708), by the controller (112), the output (650) until determining to change the operating state of the one or more components. Storing (708), by the controller (112), the output (650) until determining to change the operating state of the one or more components may be carried out by placing the output, data representing the output, or data corresponding to the output in memory or some other storage location.

Figure 8:
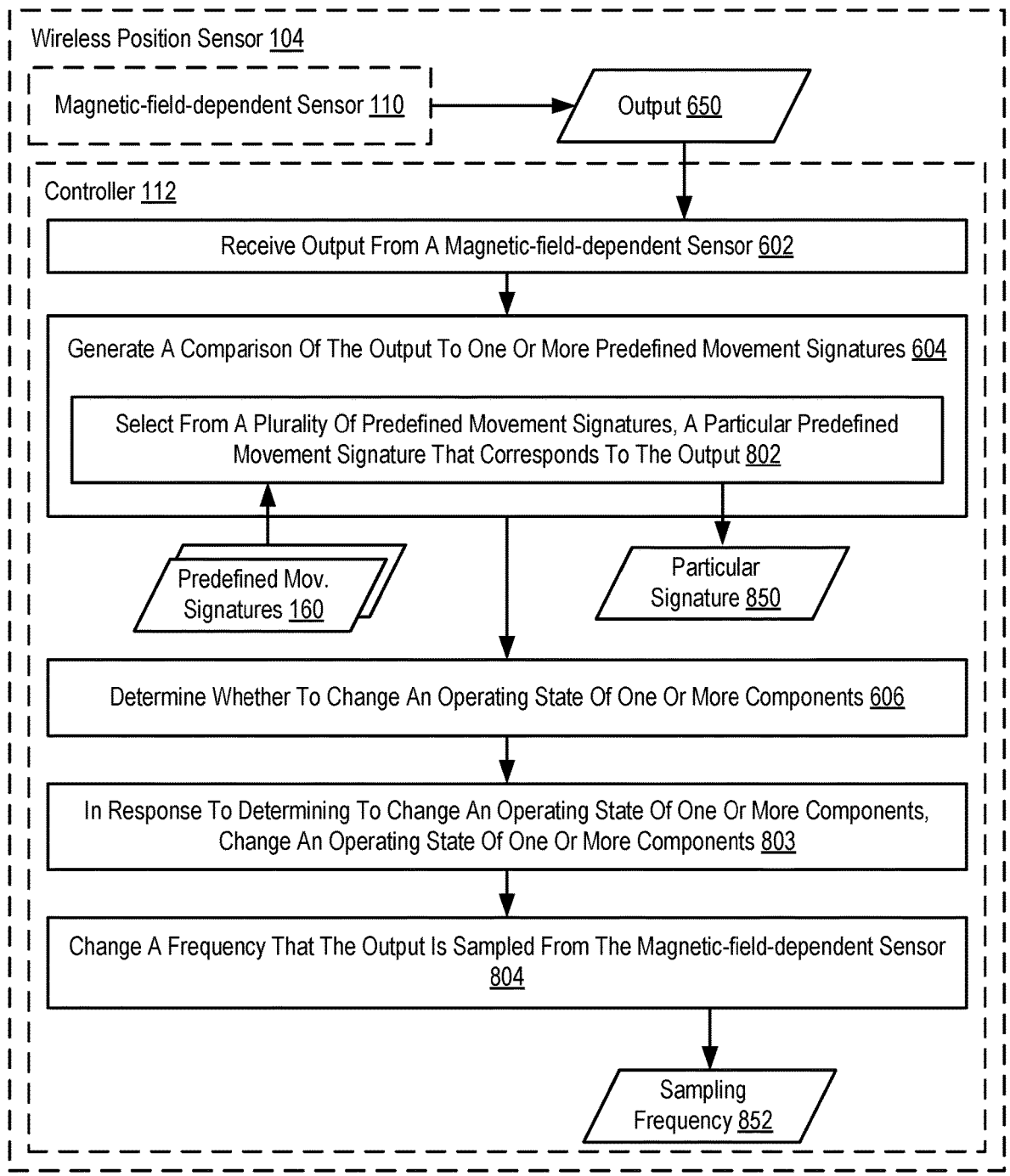
FIG. 8 is a flow chart of a third illustrative embodiment of a method of optimizing utilization of the wireless position sensor of FIG. 1.

FIG. 8 is a flow chart of a third illustrative embodiment of a method of optimizing utilization of the wireless position sensor (104) of FIG. 1. The method of FIG. 8 is similar to the method of FIG. 6 in that the method of FIG. 8 also includes receiving (602), by a controller (112) of a wireless position sensor (104), output (650) from a magnetic-field-dependent sensor (110) of the wireless position sensor (104); generating (604), by the controller (112), a comparison (652) of the output (650) to one or more predefined movement signatures (160); and based on the comparison (652), determining (606), by the controller (112), whether to change an operating state of one or more components of the wireless position sensor (104).

However, in the method of FIG. 8, generating (604), by the controller (112), a comparison (652) of the output (650) to one or more predefined movement signatures (160) includes selecting (802) from a plurality of predefined movement signatures (160), a particular predefined movement signature (850) that corresponds to the output (650). Selecting (802) from a plurality of predefined movement signatures (160), a particular predefined movement signature (850) that corresponds to the output (650) may be carried out by using data comparison algorithms to identify matches, similarities, approximations, thresholds, or any other metrics or comparisons that may be useful for determining if the output corresponds to data in a predefined movement signature.

The method of FIG. 8 also includes in response to selecting the particular predefined movement signature (850), changing (803), by the controller (112), an operating state of one or more components. Changing (803), by the controller (112), an operating state of one or more components may be carried out by identifying one or more actions for one or more components of the wireless position sensor (104) to perform and instructing the one or more components to perform the identified actions. For example, a signature rule may specify one or more actions to take in response to the output of the magnetic-field-dependent sensor satisfying one ore more conditions specified in the signature rule. Actions may include waking up a particular component and instructing a particular component to perform an action. For example, identifying one or more actions for one or more components of the wireless position sensor (104) to perform and instructing the one or more components to perform the identified actions may include waking up the wireless communicator (118) and instructing the wireless communicator (118) to transmit data associated with the output of the magnetic-field-dependent sensor (110) and stored data (164) associated with previously sampled output.

The method of FIG. 8 also includes in response to selecting the particular predefined movement signature (850), changing (804), by the controller (112), a frequency (852) that the output (650) is sampled from the magnetic-field-dependent sensor (110). Changing (804), by the controller (112), a frequency (852) that the output (650) is sampled from the magnetic-field-dependent sensor (110) may be carried out by setting or more parameters that the controller references. For example, if the wireless position sensor (104) determines that the output corresponds to rapid braking, as defined by one or more predefined movement signatures, a signature rule may be created to increase the frequency that the output is sampled from the magnetic-field-dependent sensor.

Figure 9:
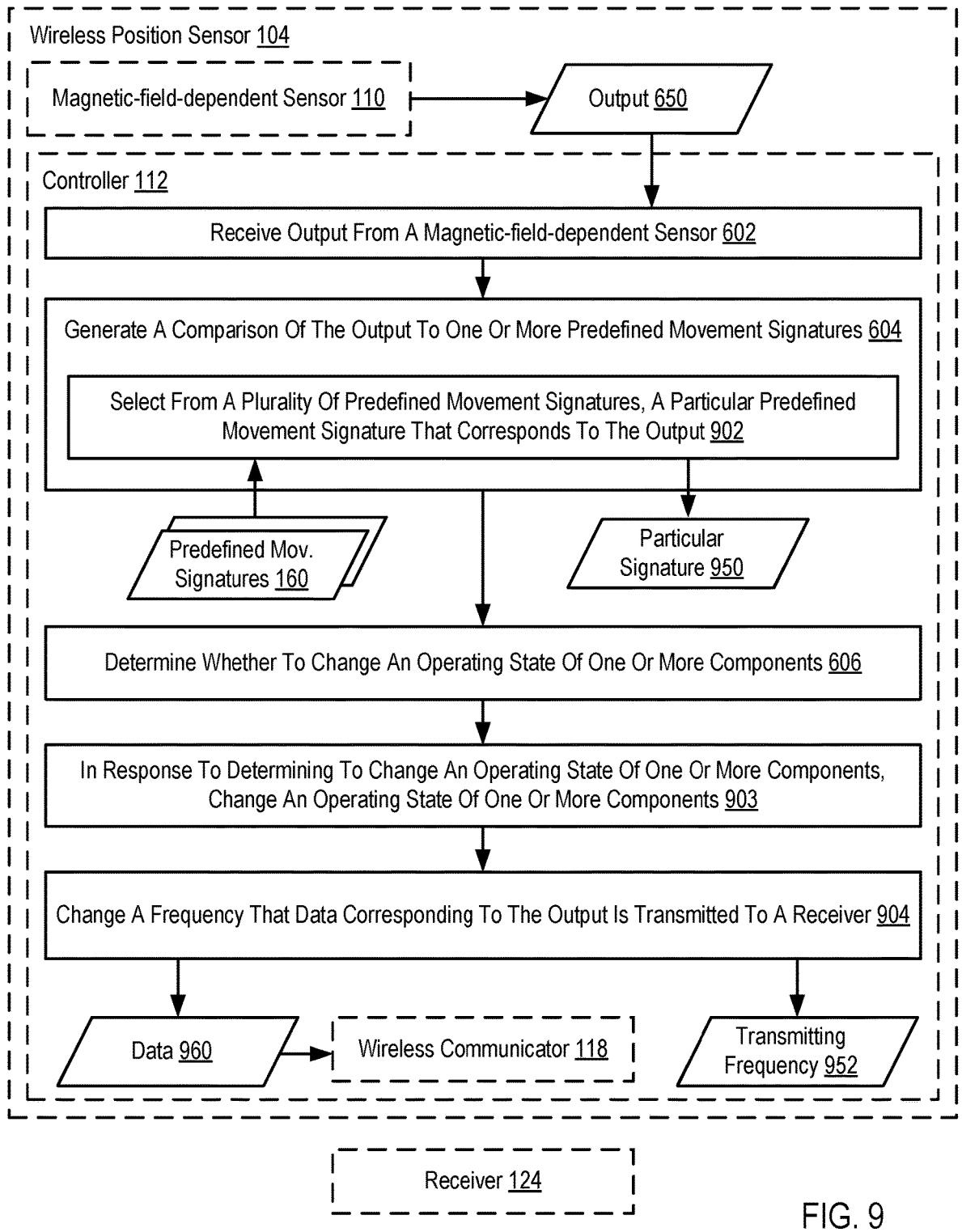
FIG. 9 is a flow chart of a fourth illustrative embodiment of a method of optimizing utilization of the wireless position sensor of FIG. 1.

FIG. 9 is a flow chart of a fourth illustrative embodiment of a method of optimizing utilization of the wireless position sensor (104) of FIG. 1. The method of FIG. 9 is similar to the method of FIG. 6 in that the method of FIG. 9 also includes receiving (602), by a controller (112) of a wireless position sensor (104), output (650) from a magnetic-field-dependent sensor (110) of the wireless position sensor (104); generating (604), by the controller (112), a comparison (652) of the output (650) to one or more predefined movement signatures (160); and based on the comparison (652), determining (606), by the controller (112), whether to change an operating state of one or more components of the wireless position sensor (104).

However, in the method of FIG. 9, generating (604), by the controller (112), a comparison (652) of the output (650) to one or more predefined movement signatures (160) includes selecting (902) from a plurality of predefined movement signatures (160), a particular predefined movement signature (950) that corresponds to the output (650). Selecting (902) from a plurality of predefined movement signatures (160), a particular predefined movement signature (950) that corresponds to the output (650) may be carried out by using data comparison algorithms to identify matches, similarities, approximations, thresholds, or any other metrics or comparisons that may be useful for determining if the output corresponds to data in a predefined movement signature.

The method of FIG. 9 also includes in response to selecting the particular predefined movement signature (950), changing (903), by the controller (112), an operating state of one or more components. Changing (903), by the controller (112), an operating state of one or more components may be carried out by identifying one or more actions for one or more components of the wireless position sensor (104) to perform and instructing the one or more components to perform the identified actions. For example, a signature rule may specify one or more actions to take in response to the output of the magnetic-field-dependent sensor satisfying one ore more conditions specified in the signature rule. Actions may include waking up a particular component and instructing a particular component to perform an action. For example, identifying one or more actions for one or more components of the wireless position sensor (104) to perform and instructing the one or more components to perform the identified actions may include waking up the wireless communicator (118) and instructing the wireless communicator (118) to transmit data associated with the output of the magnetic-field-dependent sensor (110) and stored data (164) associated with previously sampled output.

The method of FIG. 9 also includes in response to selecting the particular predefined movement signature (850), changing (904), by the controller (112), a frequency (952) that the data (960) corresponding to the output (650) is transmitted to a receiver (124). Changing (904), by the controller (112), a frequency (952) that the data (960) corresponding to the output (650) is transmitted to a receiver (124) may be carried out by setting or more parameters that the controller or the wireless communicator references. For example, if the wireless position sensor (104) determines that the output corresponds to rapid braking, as defined by one or more predefined movement signatures, a signature rule may be created to increase the frequency that the output is transmitted via a wireless communicator within the wireless position sensor.

It will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may be dependent from any or all claims in a multiple dependent manner even though such has not been originally claimed.

What is claimed is:

1. A method of optimizing utilization of a wireless position sensor, the method comprising:
receiving, by a controller of the wireless position sensor, output from a magnetic-field dependent sensor of the wireless position sensor, the magnetic-field-dependent sensor configured to register the strength of a magnetic field of a magnet attached to a mechanical component, the registered strength corresponding to a position of the mechanical component along a directional path;

generating, by the controller, a comparison of the output to one or more predefined movement signatures; and based on the comparison, determining, by the controller, whether to change an operating state of one or more components of the wireless position sensor.

2. The method of claim 1 further comprising in response to determining to change the operating state of one or more components of the wireless position sensor, waking up, by the controller, a wireless communicator of the wireless position sensor and transmitting, by the controller, using the wireless communicator, to a receiver, data corresponding to the output.

3. The method of claim 1 further comprising in response to determining to not change the operating state of one or more components of the wireless position sensor, storing, by the controller, the output until determining to change the operating state of the one or more components.

4. The method of claim 1 wherein generating the comparison of the output to one or more predefined movement signatures includes selecting from a predefined movement signatures, a particular predefined movement signature that corresponds to the output; and further comprising in response to selecting the particular predefined movement signature, changing, by the controller, a frequency that the output is sampled from the magnetic field-dependent sensor.

5. The method of claim 1 wherein generating the comparison of the output to one or more predefined movement signatures includes selecting from a predefined movement signatures, a particular predefined movement signature that corresponds to the output; and further comprising in response to selecting the particular predefined movement signature, changing, by the controller, a frequency that data corresponding to the output is transmitted to a receiver.

6. The method of claim 1 wherein changing the operating state of the one or more components includes switching a component from a low power operating state to a normal operating state.

7. The method of claim 1 wherein the magnetic-field-dependent sensor is an anisotropic magnetoresistive (AMR) sensor.

8. An apparatus for optimizing utilization of a wireless position sensor, the apparatus comprising a computer processor and computer memory operatively coupled to the computer processor, the computer memory including computer program instructions that when executed by the computer processor cause the apparatus to carry out the steps of:

receiving, by a controller of the wireless position sensor, output from a magnetic-field dependent sensor of the wireless position sensor, the magnetic-field-dependent sensor configured to register the strength of a magnetic field of a magnet attached to a mechanical component, the registered strength corresponding to a position of the mechanical component along a directional path;

generating, by the controller, a comparison of the output to one or more predefined movement signatures; and based on the comparison, determining, by the controller, whether to change an operating state of one or more components of the wireless position sensor.

9. The apparatus of claim 8 further comprising computer program instructions that when executed by the computer processor cause the apparatus to carry out the steps of: in response to determining to change the operating state of one or more components of the wireless position sensor, waking up, by the controller, a wireless communicator of the wireless position sensor and transmitting, by the controller, using the wireless communicator, to a receiver, data corresponding to the output.

10. The apparatus of claim 8 further comprising computer program instructions that when executed by the computer processor cause the apparatus to carry out the steps of: in response to determining to not change the operating state of one or more components of the wireless position sensor, storing, by the controller, the output until determining to change the operating state of the one or more components.

11. The apparatus of claim 8 wherein generating the comparison of the output to one or more predefined movement signatures includes selecting from a plurality of predefined movement signatures, a particular predefined movement signature that corresponds to the output; and further comprising computer program instructions that when executed by the computer processor cause the apparatus to carry out the steps of: in response to selecting the particular predefined movement signature, changing, by the controller, a frequency that the output is sampled from the magnetic-field-dependent sensor.

12. The apparatus of claim 8 wherein generating the comparison of the output to one or more predefined movement signatures includes selecting from a plurality of predefined movement signatures, a particular predefined movement signature that corresponds to the output; and further comprising computer program instructions that when executed by the computer processor cause the apparatus to carry out the steps of: in response to selecting the particular predefined movement signature, changing, by the controller, a frequency that the data corresponding to the output is transmitted to a receiver.

13. The apparatus of claim 8 wherein changing the operating state of the one or more components includes switching a component from a low power operating state to a normal operating state.

14. The apparatus of claim 8 wherein the magnetic-field-dependent sensor is an anisotropic magnetoresistive (AMR) sensor.

15. A computer program product for optimizing utilization of a wireless position sensor, the computer program product disposed upon a computer readable storage medium comprising computer program instructions that when executed by a computer processor cause the computer processor to carry out the steps of:

receiving, by a controller of the wireless position sensor, output from a magnetic-field dependent sensor of the wireless position sensor, the magnetic-field-dependent sensor configured to register the strength of a magnetic field of a magnet attached to a mechanical component, the registered strength corresponding to a position of the mechanical component along a directional path;

generating, by the controller, a comparison of the output to one or more predefined movement signatures; and based on the comparison, determining, by the controller, whether to change an operating state of one or more components of the wireless position sensor.

16. The computer program product of claim 15 further comprising computer program instructions that when executed by the computer processor cause the computer processor to carry out the steps of: in response to determining to change the operating state of one or more components of the wireless position sensor, waking up, by the controller, a wireless communicator of the wireless position sensor and transmitting, by the controller, using the wireless communicator, to a receiver, data corresponding to the output.

17. The computer program product of claim 15 further comprising computer program instructions that when executed by the computer processor cause the computer processor to carry out the steps of: in response to determining to change the operating state of one or more components of the wireless position sensor, storing, by the controller, a wireless communicator of the wireless position sensor and transmitting, by the controller, the output until determining to change the operating state of the one or more components.

18. The computer program product of claim 15, wherein generating the comparison of the output to one or more predefined movement signatures includes selecting from a plurality of predefined movement signatures, a particular predefined movement signature that corresponds to the output; and further comprising computer program instructions that when executed by the computer processor cause the apparatus to carry out the steps of: in response to selecting the particular predefined movement signature, changing, by the controller, a frequency that the output from the magnetic-field-dependent sensor is sampled.

19. The computer program product of claim 15, wherein generating the comparison of the output to one or more predefined movement signatures includes selecting from a plurality of predefined movement signatures, a particular predefined movement signature that corresponds to the output; and further comprising computer program instructions that when executed by the computer processor cause the apparatus to carry out the steps of: in response to selecting the particular predefined movement signature, changing, by the controller, a frequency that the data corresponding to the output is transmitted to a receiver.

20. The computer program product of claim 15 wherein changing the operating state of the one or more components includes switching a component from a low power operating state to a normal operating state.

\* \* \* \* \*